United States Patent [19]

Andersson et al.

[11] Patent Number: 5,200,711
[45] Date of Patent: Apr. 6, 1993

[54] PULSE-WIDTH MODULATED, LINEAR AUDIO-POWER AMPLIFIER

[75] Inventors: Kenneth Andersson, Kungsbacka; Dan Bavholm, Kullavik, both of Sweden

[73] Assignee: AB Lab. Gruppen Andersson & Bavholm, Kungsbacka, Sweden

[21] Appl. No.: 784,658

[22] Filed: Oct. 28, 1991

[30] Foreign Application Priority Data

Oct. 26, 1990 [SE] Sweden .............................. 9003426

[51] Int. Cl.$^5$ .............................................. H03F 3/30
[52] U.S. Cl. ...................................... 330/267; 330/297
[58] Field of Search ................. 330/10, 202, 207 A, 330/251, 297, 267, 273

[56] References Cited

U.S. PATENT DOCUMENTS

| | | | |
|---|---|---|---|
| 4,054,843 | 10/1977 | Hamada | 330/263 |
| 4,087,759 | 5/1978 | Iwamatsu | 330/262 |
| 4,472,687 | 9/1984 | Kashiwagi et al. | 330/263 X |

FOREIGN PATENT DOCUMENTS

| | | | |
|---|---|---|---|
| 2552600 | 3/1985 | France | . |
| 58303 | 5/1981 | Japan | 330/297 |
| 23309 | 2/1982 | Japan | 330/297 |
| 23310 | 2/1982 | Japan | 330/297 |
| 57-32104 | 2/1982 | Japan | . |
| 140008 | 8/1982 | Japan | 330/297 |
| 14606 | 1/1983 | Japan | 330/297 |
| 105606 | 6/1983 | Japan | 330/297 |
| 119209 | 7/1983 | Japan | 330/297 |
| 17710 | 1/1984 | Japan | 330/297 |
| 1-147907 | 6/1989 | Japan | . |

*Primary Examiner*—James B. Mullins
*Attorney, Agent, or Firm*—Young & Thompson

[57] ABSTRACT

In a push-pull-connected final stage (111) of an audio amplifier, its two supply poles (117, 118) are supplied by low-impedance current sources, the voltages of which comprise, in principle, a constant positive voltage and a constant negative voltage superimposed by the input signal to the final stage. Each of these voltages is obtained by a respective pulse-width modulated amplifier (103, 104) coacting with lowpass filter circuits (109, 110) and recovery diodes (107, 108). Distortion factors which are thirty times better than the distortion factors obtained with conventional class D-amplifiers with pulse-width modulation can be achieved.

1 Claim, 4 Drawing Sheets

PULSE-WIDTH MODULATED, LINEAR AUDIO-POWER AMPLIFIER

TECHNICAL FIELD

The present invention relates to audio signal amplifiers which utilize the principle of pulse-width modulation with class D-amplification.

BACKGROUND ART

Audio amplifiers of progressively higher power outputs have been constructed by audio engineers in an attempt to achieve improved fidelity and lower distortion levels. This has necessitated the use of progressively more and larger, and therewith more expensive power semiconductors. Power losses also increase with increasing power outputs, and in order to prevent the power semiconductors being destroyed by high temperatures, it is necessary to provide cooling means of very high capacity, which increases both the cost and the volume of the amplifier.

In the case of conventional amplifiers, particularly so-called push-pull amplifiers, the linear power amplifier is driven by two direct current sources of opposite polarity in relation to earth or to a reference. The signal to be amplified shall swing between the supply voltages—up and down—in relation to earth or the reference. As a result, current will flow through the amplifying element/transistor at the same time as a part of or the whole of the supply voltage lies across the transistor. (The whole of the supply voltage lies across the amplifying element at the same time as current flows to the load/loudspeaker when the load is reactive. Commercially available loudspeakers have a relatively large reactive impedance over a major part of their frequency ranges.) This results in a significant loss in power and therewith relatively low efficiency.

The ability of the amplifying element to deliver high reactive currents when the whole of the supply voltage is applied across said element also places high demands on power endurance and large so-called "Safe Operation Area". This requires a large number of power transistors to be connected in parallel at high power outputs, which greatly increases the cost of the amplifier.

According to one known method of minimizing power losses, the audio signal modulates the pulse width of a square wave whose frequency is much higher than the frequency of the audio signal. When the pulse width molulated square wave switches the power amplifier between the supply voltages such that current will only flow when the amplifying elements/power transistor are fully conductive and no voltage lies across said elements, only a small power loss is caused by non-ideal components. The audio signal is then recovered in a lowpass filter succeeding the amplifier, which filters-off the high frequency square wave.

Since the amplifying elements/power transistors are switched on-and-off, the efficiency or power endurance is not influenced to any great extent when the load/loudspeakers require reactive currents. This ability and the small power losses obtained are two of the important advantages obtained with class D-amplifiers.

It is thus the pulse width of the high-frequency square wave which corresponds to the instantaneous value of the audio signal. When the height of the square-wave amplitude is influenced, the audio signal is multiplied by this influence, since both pulse-width modulation and amplitude influence are recovered downstream of the lowpass filter. This places high demands on supply voltage stability and the suppression of supply voltage disturbances in class D-amplifiers. If the regulation to supply voltage is to be effected sufficiently well to achieve low amplitude modulation distortion, the efficiency of the network part is impaired, so that power losses are transferred from the power amplifier to the regulated current supply.

A known method of reducing amplitude modulation distortion involves the introduction of negative feedback. The degree of negative feedback, however, is restricted due to the phase shift in the output filter, and because it is not possible at present to give the square wave in practice a frequency which is sufficiently high (due to delay in the transistors) to eliminate the phase effect of the lowpass filter in that frequency range required to feed back the audio signal.

Another problem associated with class D-amplifiers is that when the polarity of the square wave changes, the energy in the lowpass filter must be handled via switching diodes which feed the energy back to the supply voltages. If the drop in voltage across the power semiconductors and across the so-called recovery diodes does not coincide, amplitude modulating distortion again occurs on the audio signals. Solutions to this problem are known (Attwood, U.S. Pat. No. 4,182,991), although these solutions increase the complexity.

A further problem with class D-amplifiers resides in the matching of switching times between the positive and the negative amplifying elements. Incomplete matching results in power losses, durability problems and crossover distortion. Solutions to this problem are also known (Attwood, U.S. Pat. No. 4,182,922), although these solutions reduce the reproducibility of the amplifier, because the apparatus according to this solution requires trimming.

Another known method of reducing power losses in conventional push-pull amplifiers involves controlling the direct current sources in a manner such that the supply voltages will also be influenced by the audio signal, either continuously or stepwise. This reduces the voltage across the amplifying element at the same time as current flows through said element, resulting in a relatively small power loss.

The U.S. patents to Waehner, Sampei and Carver (U.S. Pat. No. 3,772,606, 3,961,280 and 4,484,150 respectively) describe audio amplification with stepped supply voltages. The delay times of commercially available power semiconductor are, in practice, too long in order for switching to take place in a distortion-free fashion, particularly in the uppermost octave of the audio frequency range.

In the U.S. patents to Jensen and Hamada (U.S. Pat. No. 3,426,290 and U.S. Pat. No. 4,054,843 respectively), there are described audio amplifiers with continuous, adaptive supply voltages, where the supply voltage unit is effected through the medium of controlled pulse-width modulated means. Jensen describes a so-called "single ended-amplifier", i.e. an amplifier with a single supply voltage, whereas Hamada describes both a single ended and a push-pull audio amplifier with controlled pulse-width modulated supply voltage. Neither the stepped nor the continuously controlled supply voltage principles, however, give a solution to the problem of how the audio amplifier shall be able to deliver reactive current in the absence of significant power losses. At least one supply voltage, in the case of push-pull amplifiers, will lie across the amplifying element at the same time as a full reactive current flows through said element. Similar to the case with the Hamada patent, this is because the supply voltage can only be adjusted down to a minimum around the reference point/earth.

OBJECT OF THE INVENTION

The object of the present invention is to obtain the advantages afforded by a pulse-width modulated (class D) audio amplifier, such as reduced power losses and the ability to drive reactive currents, while at the same time solving the problems of amplitude modulation distortion, supply voltage regulation high frequency ripple, and to provide a cost effective and reproducible construction.

SUMMARY OF THE INVENTION

This object is achieved in accordance with the invention with a pulse-width modulated audio power amplifier according to claim 1, and with an audio power stage with pulse modulation in accordance with claim 7.

As an example of a commercially available, conventional class D-amplifier, there is shown in FIG. 3 the distortion content at 400 W (40 Vrms in 4 Ohms), which is shown as being about 1% between 20 Hz and 10 Khz. The noise dominates at lower power outputs (e.g. −20 dB beneath 400 W). this noise being the residue of the high frequency pulse-width modulated square wave. FIG. 4 shows the results obtained with the aid of the present invention. The lower curve shows the distortion content at full power output, 400 W. The distortion content is shown to be 0.03% at 1 kHz, which is thus a reduction of more than a factor of thirty, compared with FIG. 3. The upper curve shows distortion plus noise at −20 dB (4 W) power output. Although the noise dominates over the distortion residues also in this case, the noise content has been reduced to about one-tenth of the noise content obtained with the known amplifier according to FIG. 3.

The present inventive principles are explained more clearly in the following, although it will be understood that this explanation is not intended to limit the scope of the invention.

A pulse-width modulated amplifier having an input terminal to which the aforesaid input signal is also applied, is constructed to generate an output signal which consists of the aforesaid output signal from the linear amplifier plus a voltage difference in relation to the output signal. The pulse-width modulated amplifier has an output pole which is connected to the positive voltage-supply pole of the linear amplifier. The pulse-width modulated amplifier also has a supply-voltage pole which is connected to a source of DC source.

A second pulse-width modulated amplifier operates in the same manner as the first amplifier, but generates a voltage difference of opposite polarity to the first voltage difference. This second amplifier also has a supply-voltage pole which is connected to a DC source of opposite polarity, and an output pole which is connected to the negative supply-voltage pole of the linear amplifier.

The aforesaid voltage differences are selected so that the linear amplifier will obtain sufficient supply voltage to work linearly, even though the pulse-width modulated amplifiers result in a high degree of distortion As before mentioned, this distortion occurs from phenomena in pulse-width modulated amplifiers, such as supply-voltage disturbance suppression, amplitude modulating distortion and crossover distortion. At the same time, it is necessary to choose the aforesaid voltage difference at a value which is sufficiently low for the power loss in the linear amplifier to be maintained at a negligible level.

The aforesaid object of providing an amplifier which is able to drive reactive currents is fulfilled in that the pulse-width modulated amplifiers themselves take care of the major part of the supply voltage drop without resulting in an increase in power losses. Furthermore, the voltage difference across the linear amplifier will never exceed the maximum voltage that the amplifying elements in said amplifier are capable of enduring at full current load. This fulfills the object of driving reactive currents from the amplifier to the load in a cost effective manner and in the absence of significantly high power losses.

The voltage difference in an amplifier produced in practice in accordance with the above principle is between 2 V and 20 V. The lowest voltage is limited by the saturation voltage of the amplifying element in the linear amplifier, while the highest voltage is limited by the maximum voltage that the ampligying element can withstand at its maximum current usage.

The voltage difference also varies slightly at different voltage amplitudes, due to the distortion of the pulse-width modulated amplifiers. This applies particularly when maximum output voltage amplitude occurs, since the pulse-width modulated amplifiers then clip. However, provided that a sufficient voltage difference remains, the linear amplifier will operate without distortion up to the direct-current supply voltage minus the saturation voltage of the PWM-amplifier and the linear amplifier together.

BRIEF DESCRIPTION OF THE DRAWINGS

The invention will now be described in more detail with reference to the accompanying drawings.

DETAILED DESCRIPTION OF THE INVENTION

Figure 1:
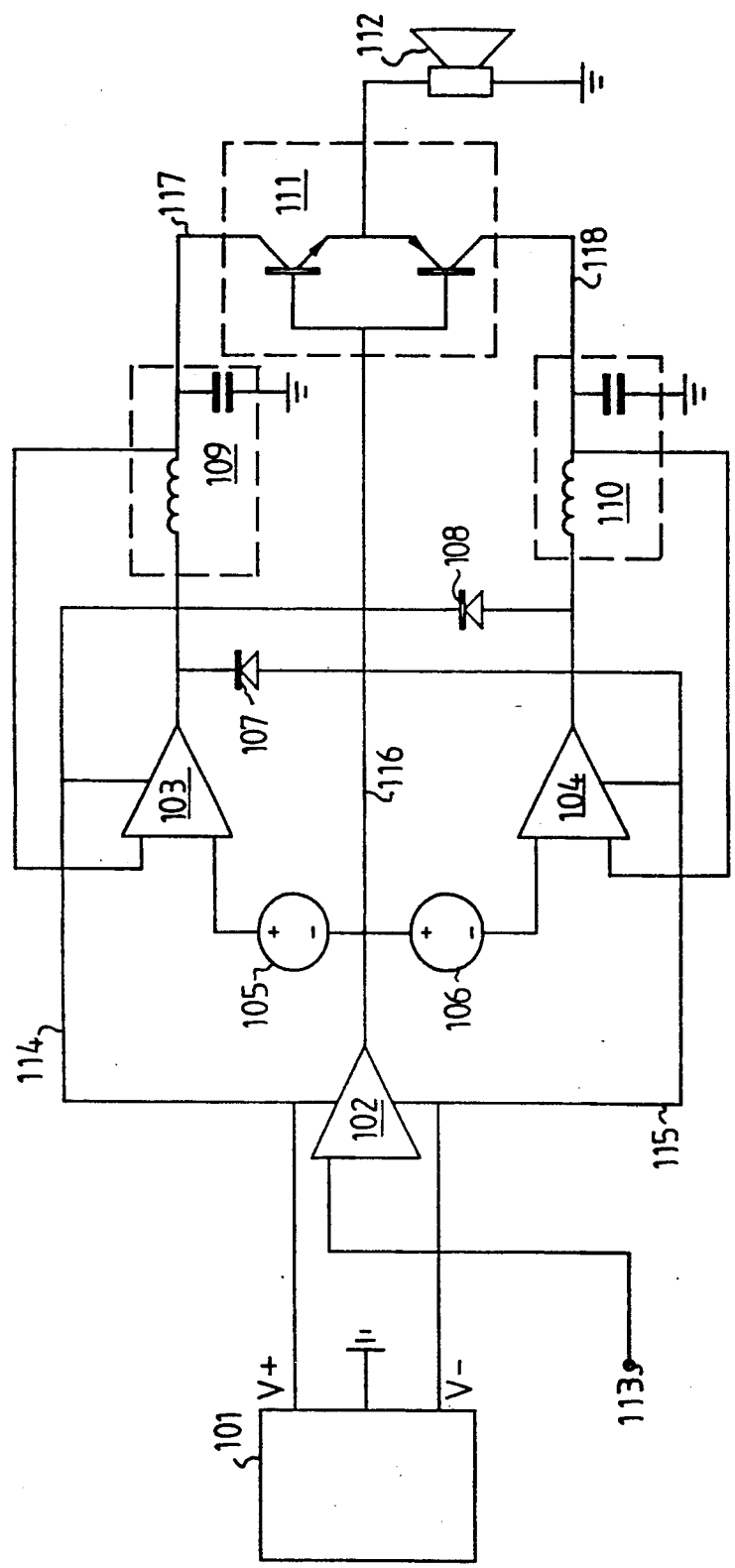
FIG. 1 illustrates schematically a circuit diagram in the nature of a block schematic of an amplifier constructed in accordance with the invention.

FIG. 1 is a block schematic of an inventive amplifier. The DC voltage source 101 delivers positive and negative output voltage to respective poles 114 and 115. The voltage amplifier 102 amplifies the audio signal obtained from the input terminal 113, so that a full swing can be obtained at point 116, when full power output is desired. The voltage-amplified signal is then applied to the linear push-pull amplifier 111, which then supplies the load/-loudspeaker 112. The voltage-amplified audio signal 116, plus a DC voltage potential 105/106, are also applied to the input of the pulse-width modulated amplifiers 103/104. The pulse width amplifiers 103 and 104 thus amplify the sum of the audio signal and the DC voltage potentials by the amplification 1 (one). The filters 109/110 regenerate audio signal plus DC voltage differences together with recovery diodes 107/108. These current amplified signals from the pulse width amplifiers 103/104 then supply the linear push-pull amplifier 111 at the points 117 and 118. The voltage difference between the supply poles 117 and 118 and the point 116 respectively is therewith equal to the DC voltage references 105 and 106 respectively. The linear amplifier 111 thus operates solely at a low supply voltage, which is determined by the references 105 and 106. The aim of achieving low power losses in the linear amplifier 111 is realized by the low voltage difference between the poles 117 and 118. At the same time, the points 117 and 118 swing over the whole of the supply voltage range, which is determined by the DC voltages at the points 114 and 115. Because of these possibilities, reactive currents can be driven in the loudspeaker 112 without significant power losses in the amplifier 111. The collector impedances in the linear amplifier 111 also assist in the suppression of supply voltage variation, high frequency ripple, and permit considerable distortion from the PWM-amplifiers 103/104. Distortion suppression is also achieved in this way, an achievement not earlier possible with class D-amplifiers.

The manner in which the linear final stage 111 operates can be seen from FIG. 1. A signal voltage $V_s$ is delivered on the input of the final stage. The power supply poles obtain respective summation voltages $V_0+V_s$ and $-V_0+V_s$, where $V_o$ and $-V_o$ are constant DC voltages. These summation voltages are favourable impedances obtained through the combination of respective current amplifying pulse width amplifiers 103, 104, recovery diodes 107, 108 and also the capacitors in the filters 109, 110. This enables the power loss in the final stage to be kept low, since maximum current through the conducting half of the final stage will be combined with a collector-base-voltage which is restricted to substantially $V_o$. It has been possible to overcome substantially the drawbacks of class D-pulse width modulating amplifiers, particularly by placing the necessary filtering stage upstream of the final stage, in combination with the existence of the constant DC voltages $V_o$ and $-V_o$.

Figure 2:
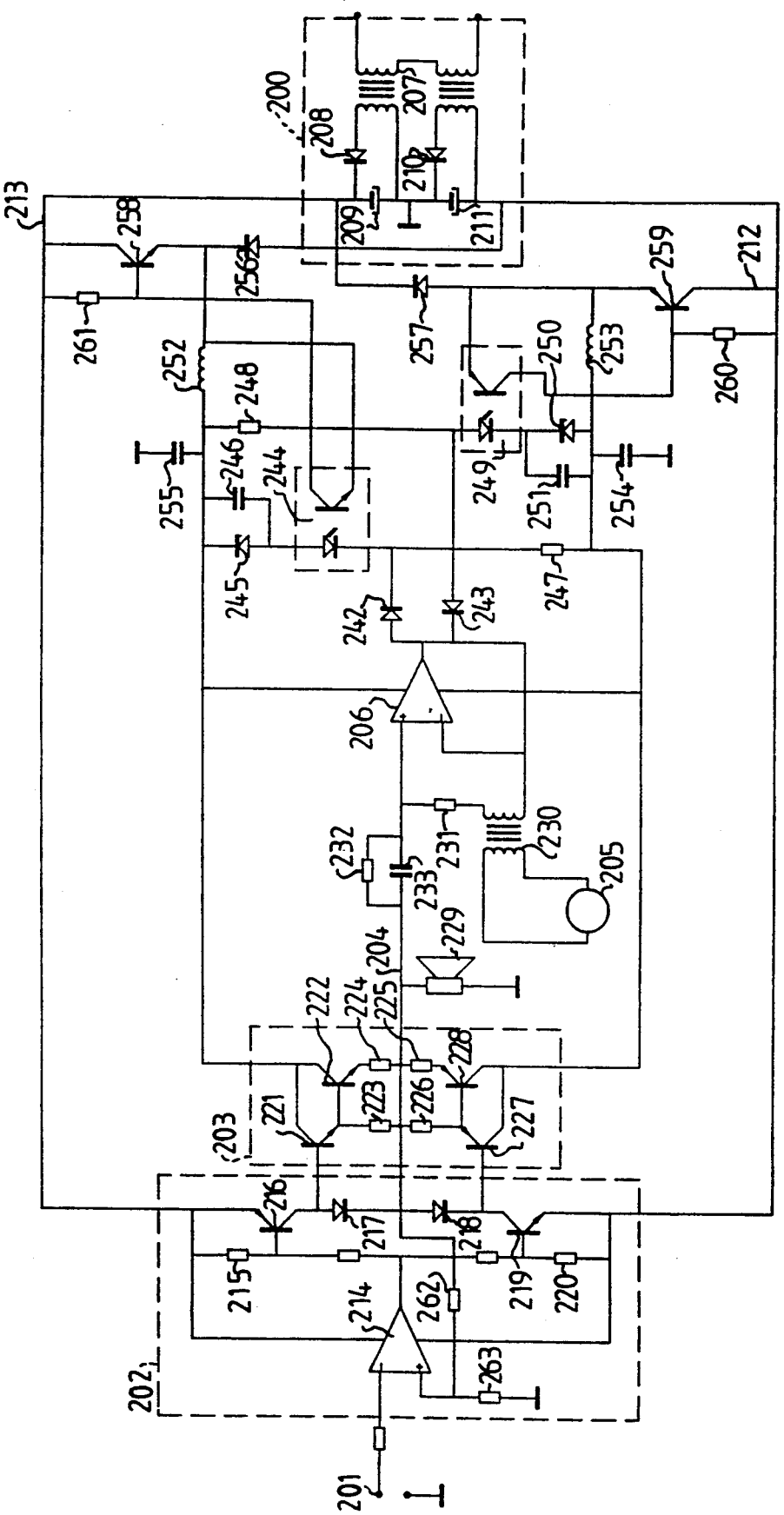
FIG. 2 is a more detailed circuit diagram of an inventive amplifier.
Figure 3:
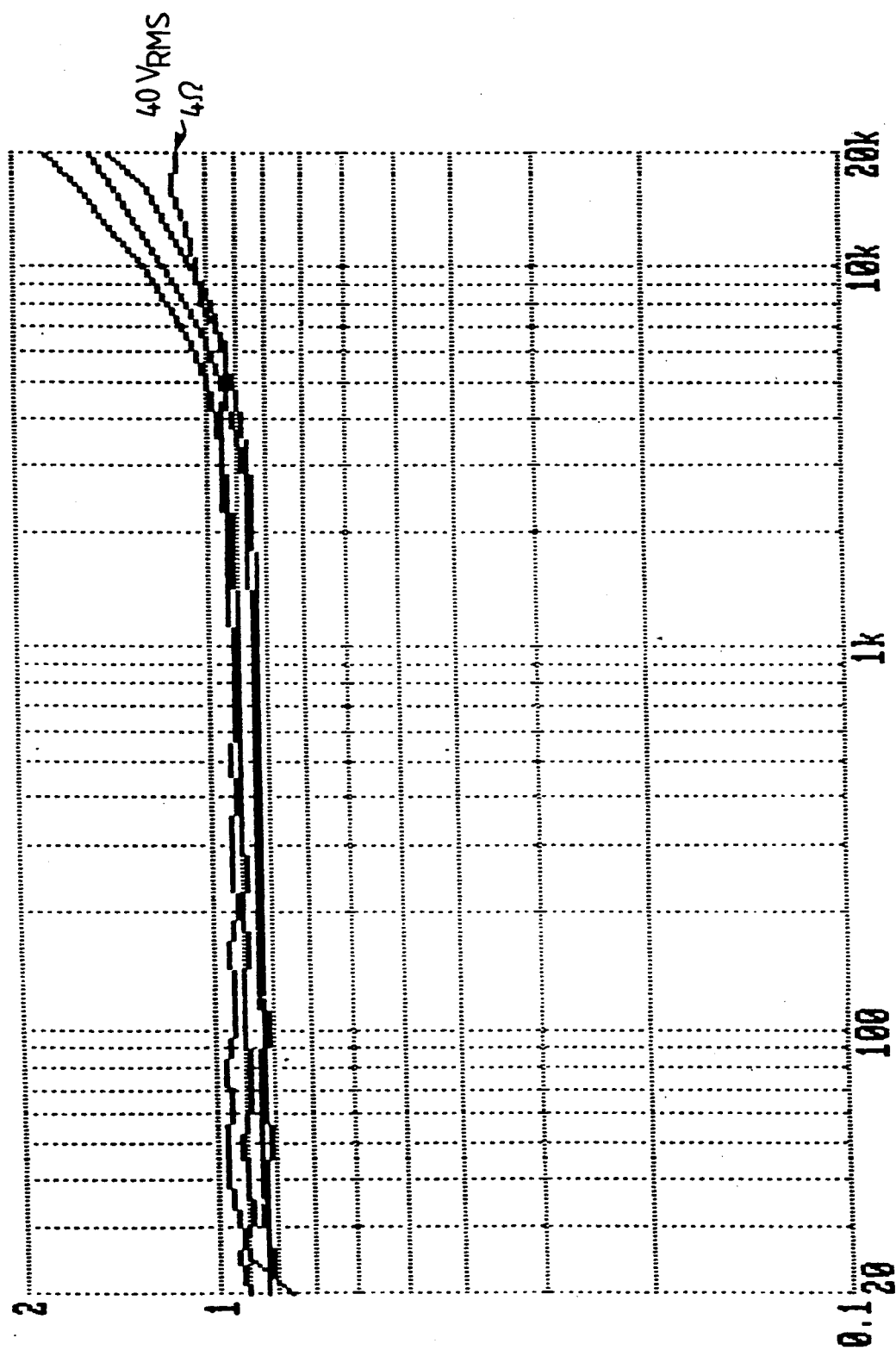
FIG. 3 illustrates distortion curves obtained with a class D-amplifier of the prior art, in a double logarithmic diagram.
Figure 4:
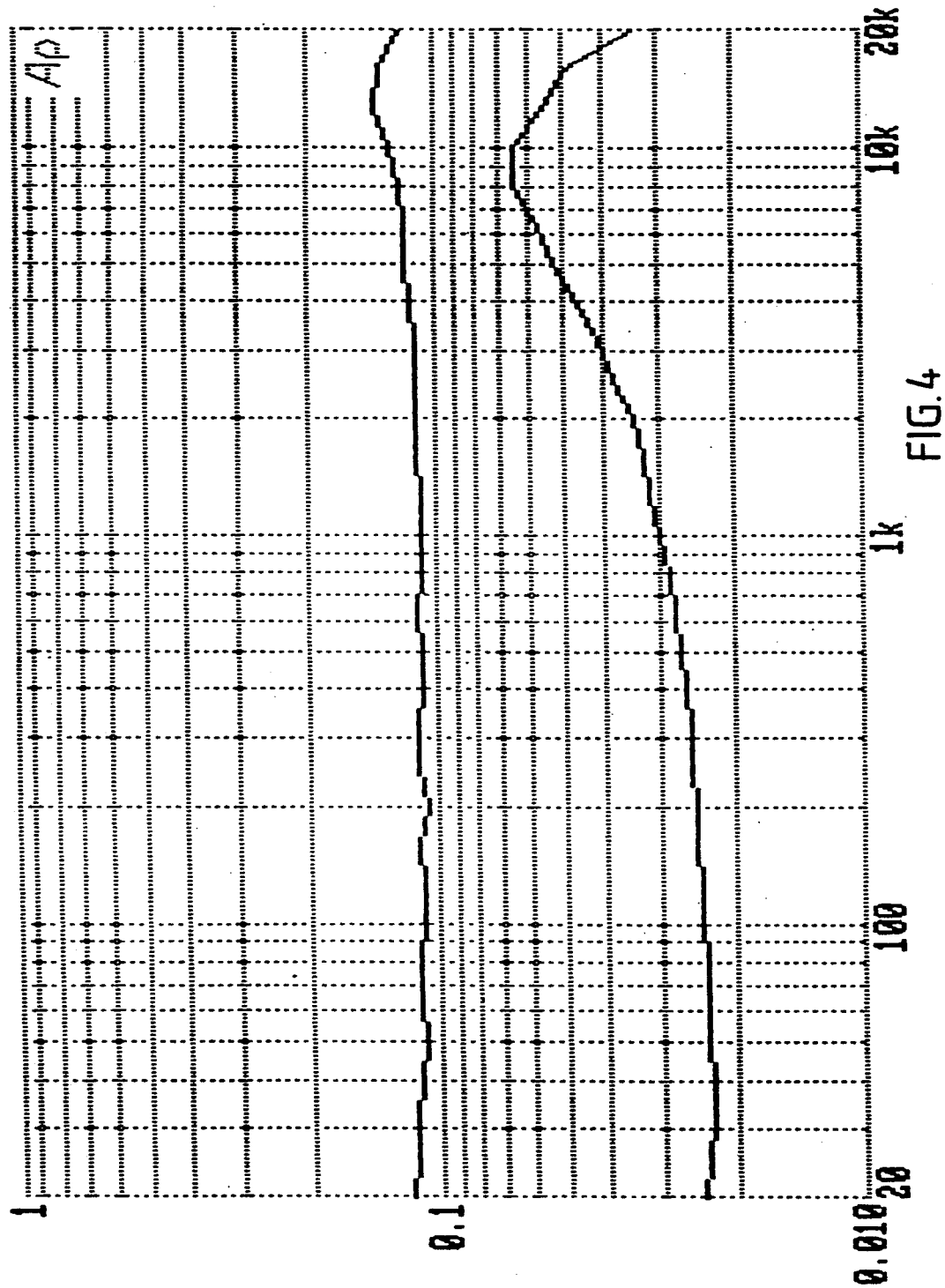
FIG. 4 illustrates corresponding distortion curves obtained with an inventive amplifier.

FIG. 2 illustrates schematically a more detailed example of the inventive solution. In this case, the DC voltage source 200 consists of the transformer 207, which when the proper ratio is chosen between the numbers of windings produces a positive DC voltage in the terminal 213 and a negative DC voltage in the terminal 212, via the diodes 208/210 and the filter capacitors 209/211. The primary side of the transformer 207 is connected to a source of alternating current, for example the electric mains supply.

The audio signal is applied at point 201 to the linear voltage amplifier 202, which in turn drives the linear push-pull-current amplifier 203, which delivers power output to the loudspeaker 229. In the case of the illustrated example, the voltage amplifier 202 consists of a feedback-coupled operational amplifier 214 (of discrete or monolithic construction), which supplies the drive transistors 216/219 through their biassing networks 215/220. The current amplifier 203 consists of the push-pull power transistors 222 and 228, with their emitter resistances 224/225. Additional current amplification is obtained by the drive transistors 221/227, the working points of which are determined by the diode network 217/218. These diodes thus determine the class in which the amplifier 203 shall work. The class can be selected from between class A, A-B or B, by selecting large forward voltage drops of mutually different values on the diodes 217/218. The positive supply-voltage terminal of the amplifier 203 is connected to the output/emitter of the pulse width modulating transistor 258, via the filtering network 252/255. Because the recovery diode 256 is connected to the negative direct current supply pole, the output of the pulse width amplifier is able to operate over the full span of the DC voltage between the points 213 and 212. Pulse-width modulation of 258 is effected in the following manner: A square wave generator 205 delivers a square wave having a frequency chosen between the frequencies 200 kHz and 2 MHz, through the isolation transformer 230. (It is desirable to obtain the highest possible switching frequency without experiencing excessively high switching losses in the transistor 258 and the diode 256, since this will reduce the size of the filter components 252 and 255 and, at the same time, the high frequency ripple downstream of the filter.) The square wave is integrated to a triangular wave by the resistor 231 and the capacitor 233. The reference side of the integration capacitor 233 is connected to the output of the voltage amplifier 203. The triangular wave is referred to the audio signal in this way. This signal impedance is adapted by the emitter follower circuit 206. The emitter follower 206 then drives the cathode of the comparator diode 242. The Zener diode 245 and the filter capacitor 246 form a constant DC voltage source, which influences the output signal from the pulse width amplifier in a manner to produce a voltage difference between the audio output signal 204 and the supply signal to the amplifier 203. The current of the Zener diode 245 flows through the opto-coupler light-emitting diode 244 to the current supply resistor 247. The comparator diode 242 modulates the light-emitting diode of the opto-coupler with the frequency of the triangular wave, and its audio signal reference modulates the pulse width. The current in the opto-coupler transistor in 244 is thus pulse-width modulated via the resistor 261 and is amplified by the power transistor 258, the collector of which is supplied by the DC voltage source 200. The emitter of the power transistor 258 then drives the filter 252/255, which forms the one output of the one pulse-width modulated amplifier.

The emitter follower 206 also drives a second comparator 243. The cathode of this diode is connected to a second opto-coupler light-emitting diode 249 and a DC voltage source 250/251 of opposite polarity (compared with 245/246). The comparator diode 243 thus modulates the pulse width of the light-emitting diode of the opto-coupler 249 with the aid of the triangular wave and the audio signal with the DC voltage offset 250/251 as a reference. The light-emitting diode then current modulates the phototransistor in 249, whose current is amplified in the second pulse width modulating power transistor 259. The opto-coupler 244/249 is thus used to isolate the potential between the comparator side and the amplifying side of the pulse-width modulated amplifiers. The collector of the power transistor 259 is supplied by the negative part of the DC voltage source 200 and its emitter drives the filter 253/254, which forms the output of the other pulse-width modulated amplifier. The outputs of the pulse-width modulated amplifiers drive, in turn, the supply terminals/collectors of the linear push-pull amplifier 203.

In the aforedescribed embodiments of the present invention, bipolar transistors have been used as amplifying elements. It will be understood, however, that field effect amplifier elements, MOS amplifying elements or like amplifying elements may also be used. It can be added that the present invention may also be applied to different variants of circuit solutions on the linear push-pull amplifier, working in class A, A-B or B, and can also be applied to both complementary and quasicomplementary circuit solutions.

It is evident that the switch can be varied in many ways without deviating from the essence of the invention, as defined in the following Claims.

We claim:

1. An audio power amplifier with pulse-width modulation, comprising a DC supply unit having two poles, a signal input, a linear push-pull connected power amplifier, having a signal output adapted to be connected to a loudspeaker means, a pulse generator having a pulse frequency of 200 kHz–2 MHz, pulse modulating means for modulating signals delivered by said pulse generator with input signals derived from said signal input into pulse modulated signals, discriminator means including a DC voltage source for obtaining discriminated pulse signals from said pulse modulated signals, class D amplifying means for amplifying said discriminated pulse signals and comprising two pulse amplifiers each supplied from a respective one of said two poles of said DC supply unit and connected to the respective other of said two poles via a respective recovery diode, and two lowpass filter circuits each connected to a respective said amplifier for delivering respective filtered supply voltages for powering said push-pull connected power amplifier, which filtered supply voltages are dependent on said input signals, said linear push-pull connected amplifier having an input that receives an input signal derived from a signal that is input to said signal input.

* * * * *